United States Patent
Shimabe et al.

(10) Patent No.: US 9,338,891 B2
(45) Date of Patent: May 10, 2016

(54) PRINTED WIRING BOARD

(71) Applicant: IBIDEN CO., LTD., Ogaki-shi (JP)

(72) Inventors: Toyotaka Shimabe, Ogaki (JP); Ryuichiro Tominaga, Ogaki (JP)

(73) Assignee: IBIDEN CO., LTD., Ogaki-shi (JP)

( * ) Notice: Subject to any disclaimer, the term of this patent is extended or adjusted under 35 U.S.C. 154(b) by 0 days.

(21) Appl. No.: 14/713,064

(22) Filed: May 15, 2015

(65) Prior Publication Data
US 2015/0334842 A1 Nov. 19, 2015

(30) Foreign Application Priority Data
May 15, 2014 (JP) ................................. 2014-101546

(51) Int. Cl.
| H05K 1/18 | (2006.01) |
| H05K 1/03 | (2006.01) |
| H05K 1/11 | (2006.01) |
| H05K 1/02 | (2006.01) |

(52) U.S. Cl.
CPC .............. *H05K 1/183* (2013.01); *H05K 1/0298* (2013.01); *H05K 1/0313* (2013.01); *H05K 1/115* (2013.01); *H05K 1/185* (2013.01); *H05K 2201/0145* (2013.01); *H05K 2201/1003* (2013.01); *H05K 2201/10015* (2013.01); *H05K 2201/10022* (2013.01); *H05K 2201/10219* (2013.01)

(58) Field of Classification Search
CPC ....... H05K 1/182; H05K 1/183; H05K 1/185; H05K 1/186; H05K 1/187; H05K 1/188
See application file for complete search history.

(56) References Cited

FOREIGN PATENT DOCUMENTS

JP 2013-183029 A 9/2013

OTHER PUBLICATIONS

U.S. Appl. No. 14/713,063, filed May 15, 2015, Shimabe, et al.
U.S. Appl. No. 14/663,573, filed Mar. 20, 2015, Shimabe, et al.

*Primary Examiner* — Jeremy C Norris
(74) *Attorney, Agent, or Firm* — Oblon, McClelland, Maier & Neustadt, L.L.P.

(57) ABSTRACT

A printed wiring board includes a core substrate having a cavity, multiple electronic components accommodated in the cavity, and a build-up layer formed on the substrate and including an insulating interlayer such that the interlayer is covering the cavity. The components include a first component, second component and third component, the core substrate has a first projection structure partitioning the first and second components in the cavity and a second projection structure partitioning the second and third components in the cavity, and the cavity and the first and second structures are formed in the substrate such that T1<T2 and W1<W2 are satisfied where T1 represents distance between the first and second components, T2 represents distance between the second and third components, W1 represents width of edge of the first structure in the cavity, and W2 represents width of edge of the second structure in the cavity.

20 Claims, 10 Drawing Sheets

PRINTED WIRING BOARD

CROSS-REFERENCE TO RELATED APPLICATIONS

The present application is based upon and claims the benefit of priority to Japanese Patent Application No. 2014-101546, filed May 15, 2014, the entire contents of which are incorporated herein by reference.

BACKGROUND OF THE INVENTION

1. Field of the Invention

The present invention relates to a printed wiring board with a built-in electronic component.

2. Description of Background Art

Japanese Patent Laid-Open Publication No. 2013-183029 describes a printed wiring board in which chip capacitors are built in a core substrate. The entire contents of this publication are incorporated herein by reference.

SUMMARY OF THE INVENTION

According to one aspect of the present invention, a printed wiring board includes a core substrate having a cavity, multiple electronic components accommodated in the cavity of the core substrate, and a build-up layer formed on the core substrate and including an insulating resin interlayer such that the insulating resin interlayer is covering the cavity. The electronic components include a first electronic component, a second electronic component and a third electronic component, the core substrate has a first projection structure partitioning the first and second electronic components in the cavity and a second projection structure partitioning the second and third electronic components in the cavity, and the cavity and the first and second projection structures are formed in the core substrate such that $T1<T2$ and $W1<W2$ are satisfied where T1 represents a distance between the first and second electronic components, T2 represents a distance between the second and third electronic components, W1 represents a width of an edge of the first projection structure in the cavity, and W2 represents a width of an edge of the second projection structure in the cavity.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF THE EMBODIMENTS

Figure 1:
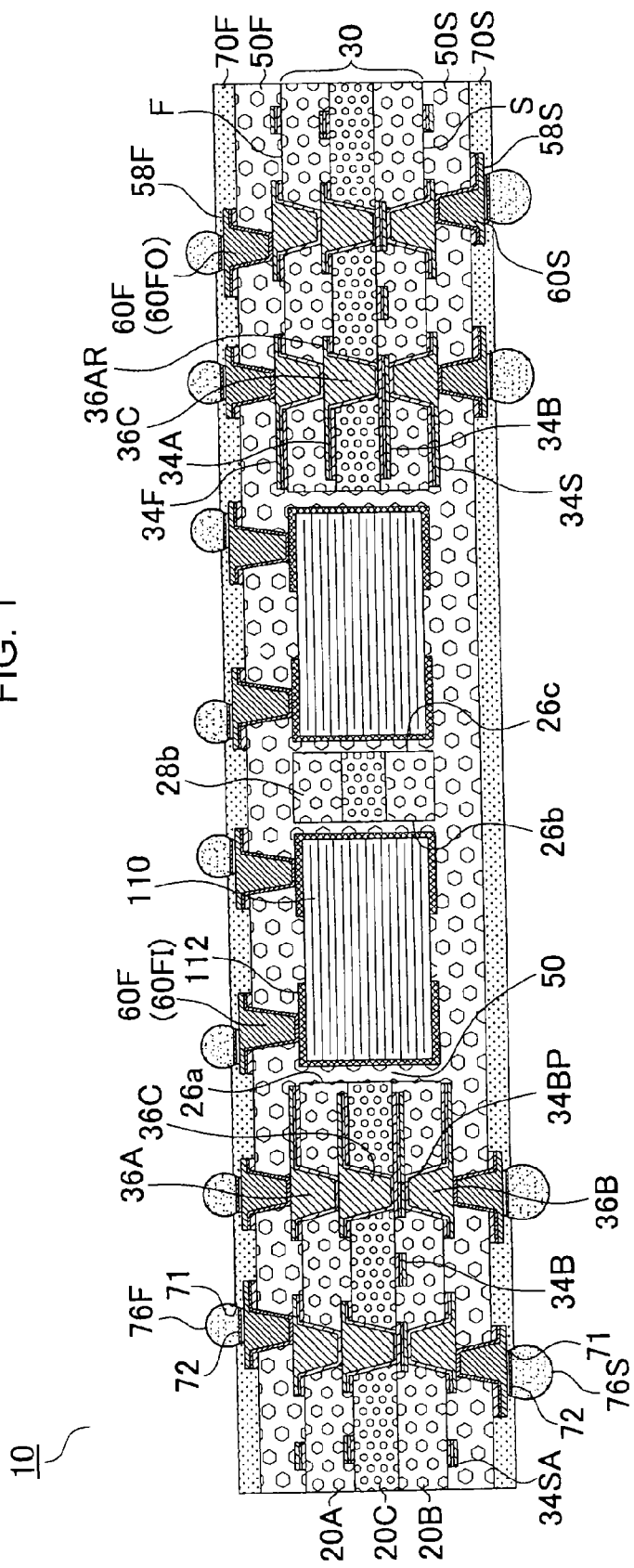
FIG. 1 is a cross-sectional view of a printed wiring board according to a first embodiment of the present invention.

The embodiments will now be described with reference to the accompanying drawings, wherein like reference numerals designate corresponding or identical elements throughout the various drawings.

First Embodiment

A cross section of a printed wiring board 10 according to a first embodiment of the present invention is illustrated in FIG. 1. In the printed wiring board 10, an electronic component 110 such as a chip capacitor is built in a multilayer core substrate 30 that has a first surface (F) and a second surface (S) that is on an opposite side of the first surface. Here, the electronic component is not limited to a chip capacitor, but may also be a chip resistor, an inductor or a thermistor.

The multilayer core substrate 30 of the printed wiring board of the first embodiment has a third resin layer (20C), and has a first resin layer (20A) and a second resin layer (20B) that sandwich the third resin layer. The first resin layer is an uppermost layer of the core substrate, and the second resin layer is a lowermost layer of the core substrate. The first surface (F) of the core substrate and a first surface of the resin layers are the same surface; and the second surface (S) of the core substrate and a second surface of the resin layers are the same surface. The resin layers (20C, 20A, 20B) each have a reinforcing material.

The core substrate has a first conductor layer (34F) on the first surface of the first resin layer, a second conductor layer (34S) on the second surface of the second resin layer, a third conductor layer (34A) between the first resin layer and the third resin layer, and a fourth conductor layer (34B) between the second resin layer and the third resin layer. The first, second and third conductor layers each include a via land. The fourth conductor layer includes a via pad (34BP) (pad of a via conductor). The first, second, third and fourth conductor layers each may further include a conductor circuit.

The core substrate further has an interlayer connection conductor (via conductor) (36A) that penetrates through the first resin layer and connects the first conductor layer and the third conductor layer, an interlayer connection conductor (via conductor) (36B) that penetrates through the second resin layer and connects the second conductor layer and the fourth conductor layer, and an interlayer connection conductor (via conductor) (36C) that penetrates through the third resin layer and connects the third conductor layer and the fourth conductor layer.

The via conductors (36A, 36B, 36C) are linearly laminated. A through-hole conductor is formed by these via conductors and the via pad (34BP) that is sandwiched by the via conductor (36B) and the via conductor (36C). The via conductor (36A) is directly laminated on the via conductor (36C). The via conductor (36C) and the via conductor (36B) sandwich the via pad (34BP). When the thicknesses of the resin layers are substantially the same, the via conductors of the resin layers have equal lengths. Reliability of the through-hole conductor is increased.

Figure 2:
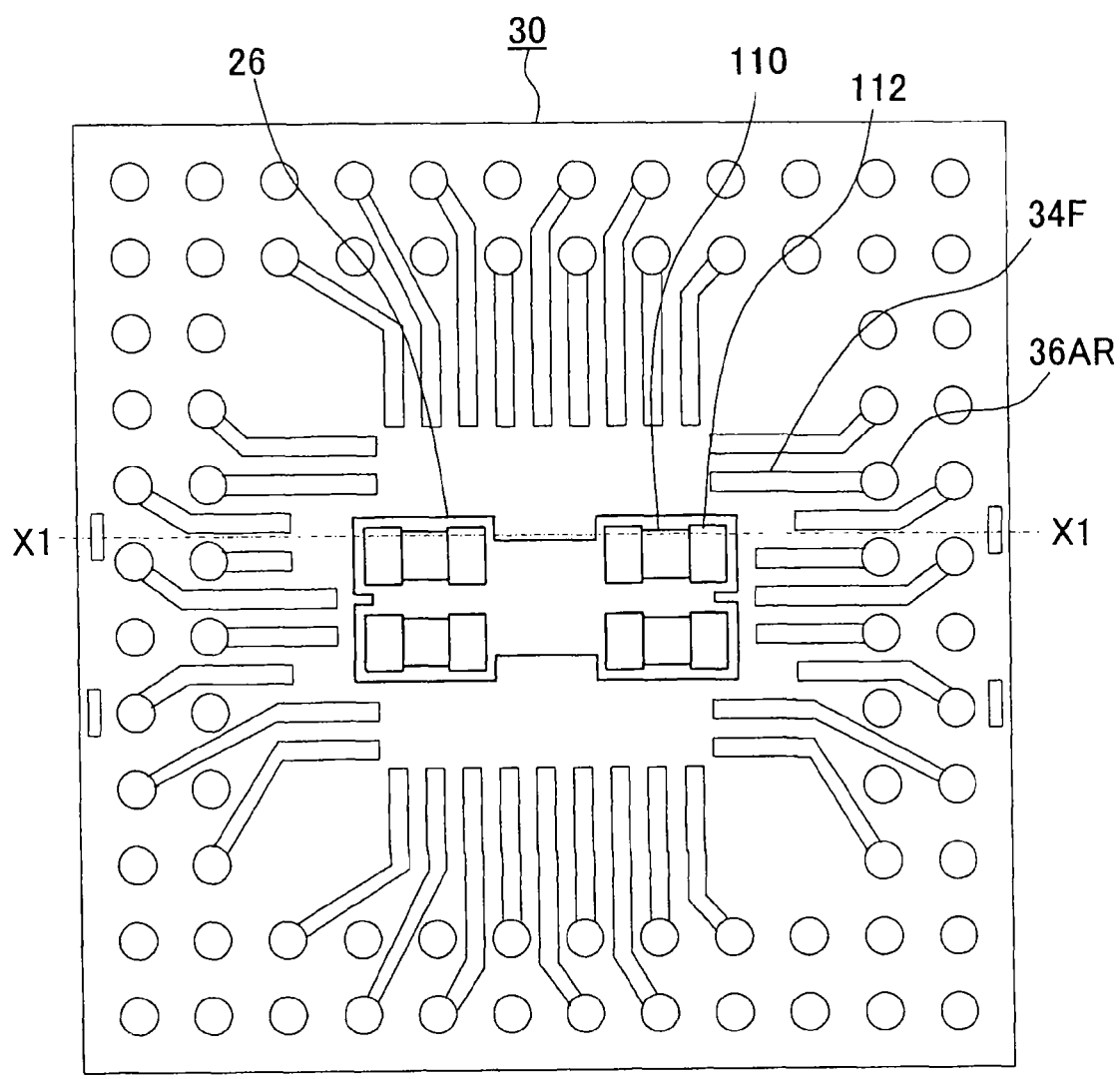
FIG. 2 is a plan view of a multilayer core substrate of the printed wiring board according to the first embodiment.

FIG. 2 is a plan view of the multilayer core substrate 30 in FIG. 1. An X1-X1 cross section in FIG. 2 corresponds to FIG. 1. The core substrate has a cavity 26 that extends from the first surface (F) to the second surface (S). The cavity 26 penetrates through the resin layers that form the core substrate. Four electronic components 110 are accommodated in the cavity 26. On the multilayer core substrate, a land (36AR) of the via conductor (36A) described above with reference to FIG. 1 and the first conductor layer (34F) are formed.

Figure 3A:
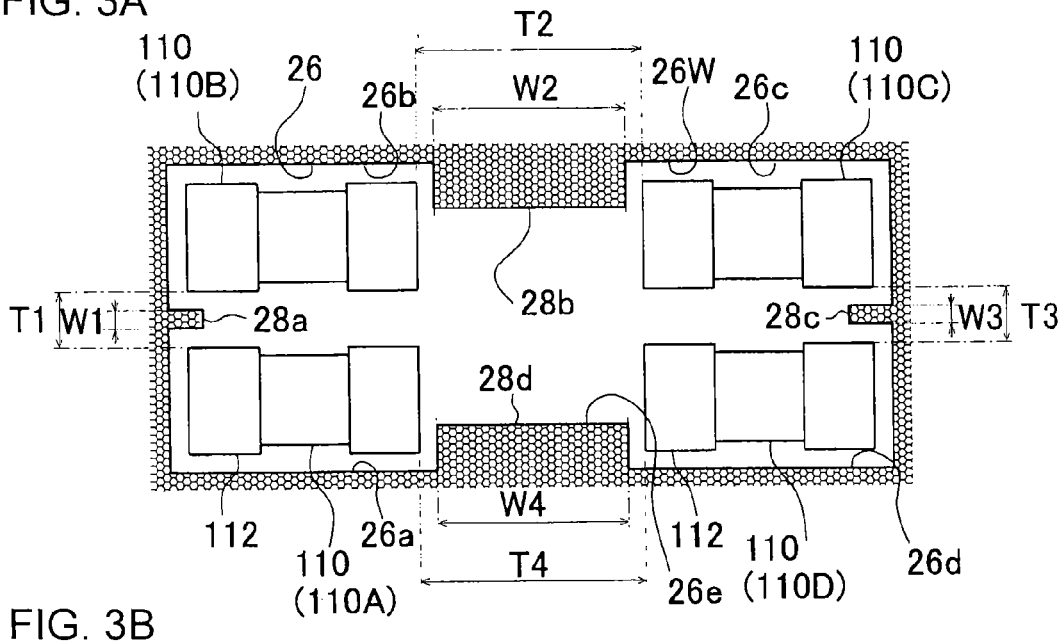
FIG. 3A-3C are plan views illustrating cavities.

The cavity 26 in FIG. 2 is illustrated in FIG. 3A.

The cavity 26 includes a rectangular first space part (26a) for accommodating a first electronic component (110A), a rectangular second space part (26b) for accommodating a second electronic component (110B), a rectangular third space part (26c) for accommodating a third electronic component (110C), a rectangular fourth space part (26d) for accommodating a fourth electronic component (110D), a rectangular first projection (28a) for partitioning between the first electronic component (110A) of the first space part (26a) and the second electronic component (110B) of the second space part (26b), a rectangular second projection (28b) for partitioning between the second electronic component (110B) of the second space part (26b) and the third electronic component (110C) of the third space part (26c), a rectangular third projection (28c) for partitioning between the third electronic component (110C) of the third space part (26c) and the fourth electronic component (110D) of the fourth space part (26d), and a rectangular fourth projection (28d) for partitioning between the fourth electronic component (110D) of the fourth space part (26d) and the first electronic component (110A) of the first space part (26a). The projections (28a, 28b, 28c, 28d) project from a side wall (26W) of the cavity in directions parallel to the first and second surfaces of the multilayer core substrate and are formed in such a manner that the first projection (28a) and the third projection (28c) oppose each other and the second projection (28b) and the fourth projection (28d) oppose each other. Between the second projection (28b) and the fourth projection (28d), a communicating part (26e) is formed that connects the first and second space parts (26a, 26b) and the third and fourth space parts (26c, 26d). As illustrated in FIG. 1, a via conductor (60FI) is connected to a terminal 112 of an electronic component 110 accommodated in a space part.

In the first embodiment, a distance (T1) between the first electronic component (110A) and the second electronic component (110B), a distance (T2) between the second electronic component (110B) and the third electronic component (110C), a width (W1) of the first projection (28a) and a width (W2) of the second projection (28b) satisfy T1<T2 and W1<W2.

Further, a distance (T3) between the third electronic component (110C) and the fourth electronic component (110D), a distance (T4) between the fourth electronic component (110D) and the first electronic component (110A), a width (W3) of the third projection (28c) and a width (W4) of the fourth projection (28d) satisfy T3<T4 and W3<W4.

The space parts (26a, 26b, 26c, 26d) that respectively accommodate the four electronic components (110A, 110B, 110C, 110D) and the projections (28a, 28b, 28c, 28d) that partition between the electronic components are formed in the cavity 26. The first projection (28a) having a small width of the width (W1) is provided between the first electronic component (110A) and the second electronic component (110B) that are arranged relatively closer to each other at the distance (T1). The second projection (28b) having a large width of the width (W2) is provided between the second electronic component (110B) and the third electronic component (110C) that are arranged relatively farther away from each other at the distance (T2). The third projection (28c) having a small width of the width (W3) is provided between the third electronic component (110C) and the fourth electronic component (110D) that are arranged relatively closer to each other at the distance (T3). The fourth projection (28d) having a large width of the width (W4) is provided between the fourth electronic component (110D) and the first electronic component (110A) that are arranged relatively farther away from each other at the distance (T4). The first electronic component, the second electronic component, the third electronic component and the fourth electronic component having different mutual distances are respectively properly positioned. Further, even when electronic components having different mutual arrangement distances coexist, it does not cause a contact failure or the like to occur between the electronic components. Therefore, flexibility in designing a size of the cavity is increased. That the width (W1) of the first projection and the width (W3) of the third projection are equal and the width (W2) of the second projection (28b) and the width (W4) of the fourth projection (28d) are equal allows symmetry of the cavity to be maintained and thus is preferable.

Further, even when electronic components having different mutual distances coexist, it does not cause a contact failure or the like to occur between the electronic components. Therefore, flexibility in designing the size of the cavity is increased. In the present embodiment, the four electronic components are accommodated in the cavity 26. Therefore, as compared to a case where four cavities each accommodating one electronic component are arranged side by side, a dead space for wiring is reduced and wiring arrangement is facilitated.

Figure 3B:
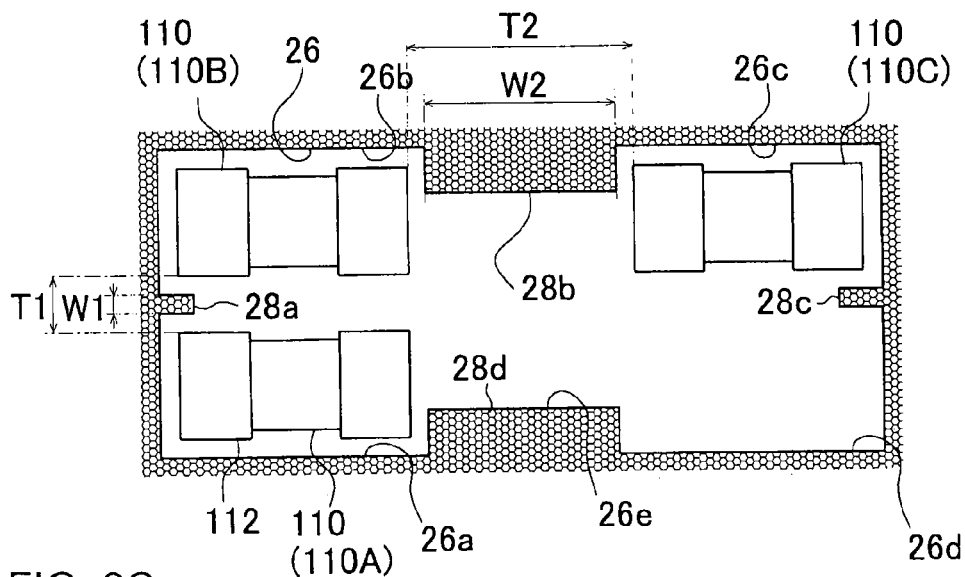

FIG. 3B illustrates a state in which three electronic components are accommodated in the cavity 26.

The space parts (26a, 26b, 26c) that respectively accommodate three or more electronic components (110A, 110B, 110C) and the first projection (28a) and the second projection (28b) that partition between the electronic components are formed in the cavity. The first projection (28a) having a small width of the width (W1) is provided between the first electronic component (110A) and the second electronic component (110B) that are arranged relatively closer to each other at the distance (T1). The second projection (28b) having a large width of the width (W2) is provided between the second electronic component (110B) and the third electronic component (110C) that are arranged relatively farther away from each other at the distance (T2). The first electronic component, the second electronic component and the third electronic component having different mutual distances can be respectively properly positioned. The first electronic component (110A) is positioned by the first projection (28a) and the fourth projection (28d). The third electronic component (110C) is positioned by the second projection (28b) and the third projection (28c).

By using the resin layers to form the core substrate, the resin layers each have a thin thickness. Therefore, the openings for the via conductors that are formed in the respective resin layers can be easily filled by plating. Via conductors containing fewer defects such as voids or containing no defects are formed. Therefore, the through-hole conductor has a lower resistance. However, the core substrate is not limited to a multilayer core substrate, but may also be a two-layer core substrate in which a conductor layer is formed on both sides of a resin layer.

The core substrate of the first embodiment has the cavity 26 for accommodating an electronic component. Therefore, the core substrate has a low strength. However, in the first embodiment, the through-hole conductor is formed by filled vias and a via pad that is made of metal. Therefore, the core substrate has a high strength. Therefore, even when the core substrate has the cavity for accommodating an electronic component, warpage of the printed wiring board is small. The electronic component that is built in the core substrate is unlikely to be damaged. Even when the resin layers are each thin, the strength of the core substrate is increased by the through-hole conductor. Therefore, a thin electronic component can be built in the core substrate. A thickness of the core substrate is equal to or greater than a thickness of the electronic component. It is preferable that a difference between the thickness of the core substrate and the thickness of the electronic component is in a range from 0 to 220 μm.

As illustrated in FIG. 1, an upper side build-up layer is formed on the first surface (F) of the multilayer core substrate 30 and on the chip capacitor. The upper side build-up layer includes an insulating layer (first interlayer resin insulating layer) (50F) that is formed on the first surface (F) of the multilayer core substrate 30 and on the chip capacitor 110, a conductor layer (upper side conductor layer) (58F) on the insulating layer (50F), and a via conductor (60F) that penetrates through the insulating layer (50F) and connect the first conductor layer (34F) or the through-hole conductor and the conductor layer (58F). The via conductor (60F) includes a via conductor (60FI) that connects the conductor layer (58F) and an electrode 112 of an electronic component such as a chip capacitor.

A lower side build-up layer is formed on the second surface (S) of the multilayer core substrate 30 and below the chip capacitor. The lower side build-up layer includes an insulating layer (second interlayer resin insulating layer) (50S) that is formed on the second surface (S) of the multilayer core substrate 30 and below the chip capacitor, a conductor layer (lower side conductor layer) (58S) below the insulating layer (50S), and a via conductor (60S) that penetrates through the insulating layer (50S) and connects the second conductor layer (34S) or the through-hole conductor and the conductor layer (58S). The second conductor layer (34S) includes an alignment mark (34SA). A spacing in the cavity 26 for accommodating an electronic component is filled with a filler 50. The spacing is a space between the electronic component and the core substrate. The spacing is filled with a resin component of the interlayer resin insulating layer. However, the upper and lower side build-up layers may each include multiple interlayer resin insulating layers and multiple conductor layers.

Solder resist layers (70F, 70S) having openings 71 are formed on the upper side and lower side build-up layers. Upper surfaces of the conductor layers (58F, 58S) and the via conductors (60F, 60S) that are exposed by the openings 71 of the solder resist layers function as pads. Metal films 72 such as Ni/Pd/Au are formed on the pads, and solder bumps (76F, 76S) are formed on the metal films. An IC chip is mounted on the printed wiring board 10 via the solder bump (76F) that is formed on the upper side build-up layer. The printed wiring board is mounted on a motherboard via the solder bump (76S) that is formed on the lower side build-up layer.

In the first embodiment, the chip capacitor 110 is built in the multilayer core substrate 30. Therefore, a distance between the chip capacitor 110 and the mounted IC chip is short. Therefore, power is instantaneously supplied to the IC chip and thus the IC chip is unlikely to malfunction.

Manufacturing Method of First Embodiment

A method for manufacturing the printed wiring board 10 of the first embodiment is illustrated in FIG. 4A-9B.

Figure 4A:
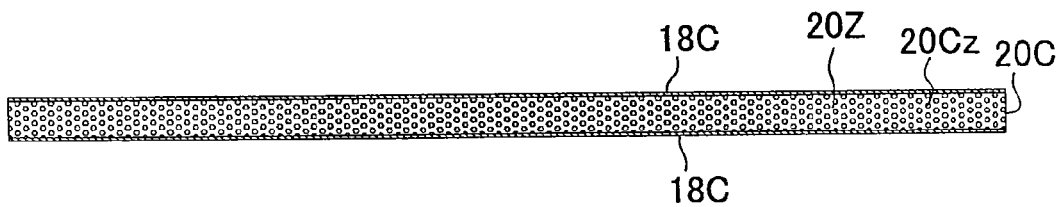
FIG. 4A-4E are process diagrams illustrating a method for manufacturing the printed wiring board of the first embodiment.

(1) A double-sided copper-clad laminated plate (20Z), which is formed from an insulating base material (20Cz) having a first surface (F) and a second surface on an opposite side of the first surface (F) and a copper foil (18C) laminated on both sides of the insulating base material (20Cz), is a starting material The insulating base material has a thickness of 45-75 μm. When the thickness is less than 45 μm, the strength of the substrate is too low. When the thickness exceeds 75 μm, the printed wiring board becomes thick. A surface of the copper foil (18C) is subjected to a blackening treatment (not illustrated in the drawings) (FIG. 4A). The insulating base material includes a glass cloth. The glass is a T glass. The insulating base material (20Cz) corresponds to the third resin layer (20C).

Figure 4B:
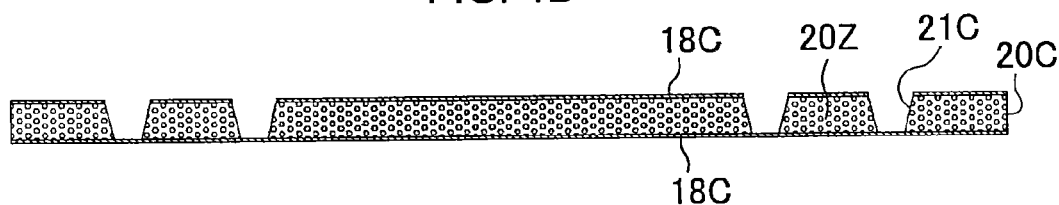

(2) Laser is irradiated to the double-sided copper-clad laminated plate (20Z) from the first surface (F) side of the insulating base material. An opening (21C) for a via conductor is formed in the insulating base material (FIG. 4B).

Figure 4C:
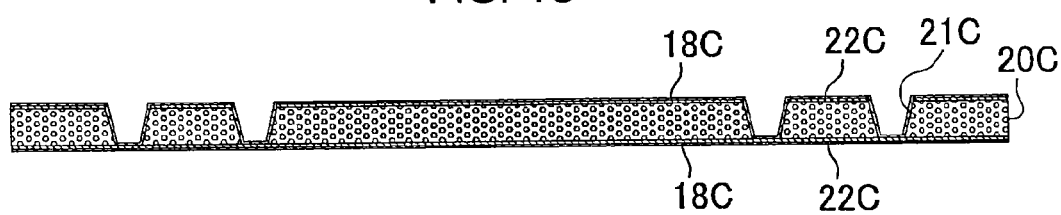

(3) By an electroless plating treatment, an electroless plating film (22C) is formed on an inner wall of the opening (21C) and on the copper foil (FIG. 4C).

Figure 4D:
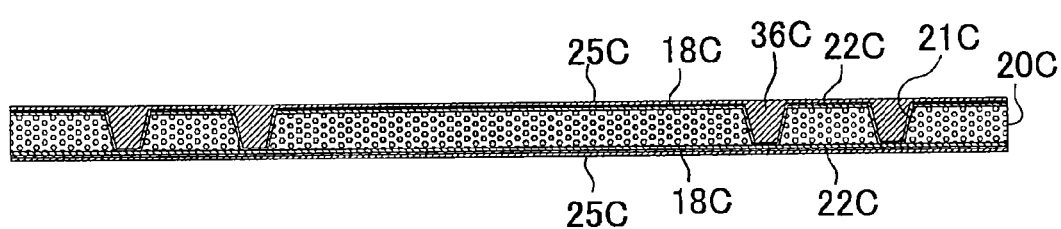

(4) By an electrolytic plating treatment, an electrolytic plating film (25C) is formed on the electroless plating film. The opening (21C) is filled by the electrolytic plating film and the via conductor (36C) is formed. The via conductor (36C) is formed by the electroless plating film (22C) that is formed on the inner wall of the opening (21C) and the electrolytic plating film (25C) that fills the opening (21C) (FIG. 4D).

Figure 4E:
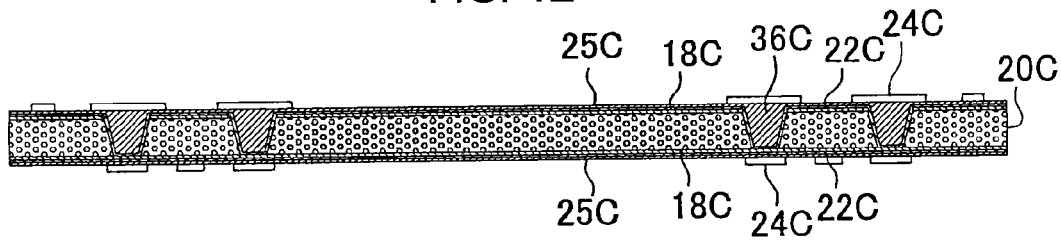

(5) An etching resist (24C) of a predetermined pattern is formed on the electrolytic plating film (26C) (FIG. 4E).

Figure 5A:
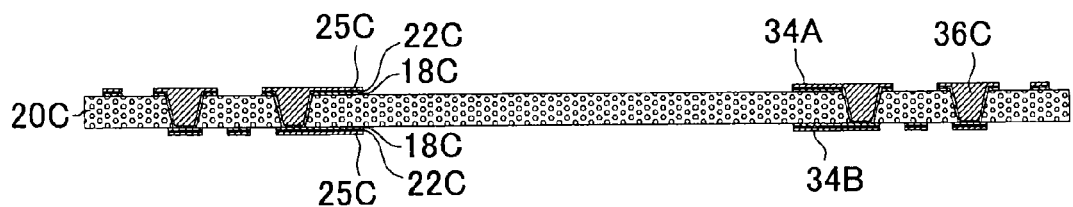
FIG. 5A-5D are process diagrams illustrating the method for manufacturing the printed wiring board of the first embodiment.

(6) The electrolytic plating film (22C), the electroless plating film (25C) and the copper foil (18C) that are exposed from the etching resist are removed. Thereafter, the etching resist is removed. The third conductor layer (34A), the fourth conductor layer (34B) and the via conductor (36C) are formed (FIG. 5A).

Figure 5B:
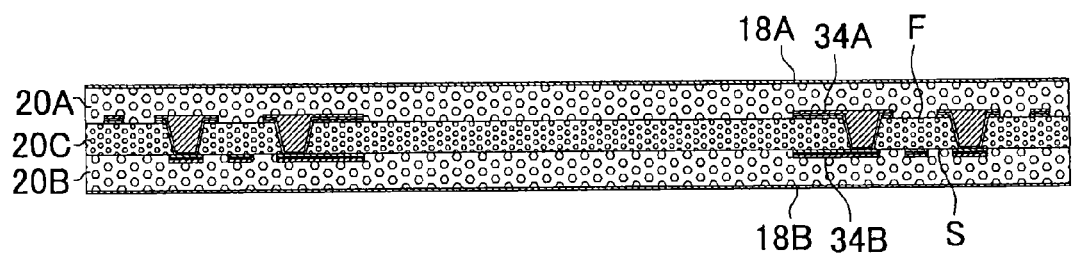

(7) A prepreg and a metal foil (18A) are superposed on the first surface (F) of the third resin layer (20C) and on the third conductor layer (34A). A prepreg and a metal foil (18B) are superposed on the second surface of the third resin layer (20C) and on the fourth conductor layer (34B). Thereafter, by hot pressing, the first resin layer (20A) and the second resin layer (20B) are formed from the prepregs (FIG. 5B). The first surface of the first resin layer and the second surface of the second resin layer are outermost layers of the core substrate.

Figure 5C:
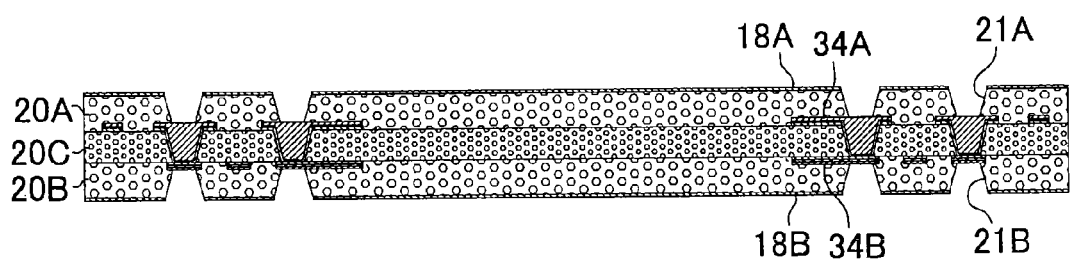

(8) An opening (21A) for a via conductor that reaches the third conductor layer (34A) on the third resin layer is formed using CO2 gas laser from the first surface side of the first resin layer (20A), and an opening (21B) for a via conductor that reaches the fourth conductor layer (34B) on the third resin layer is formed using CO2 gas laser from the second surface side of the second resin layer (20B) (FIG. 5C).

Figure 5D:
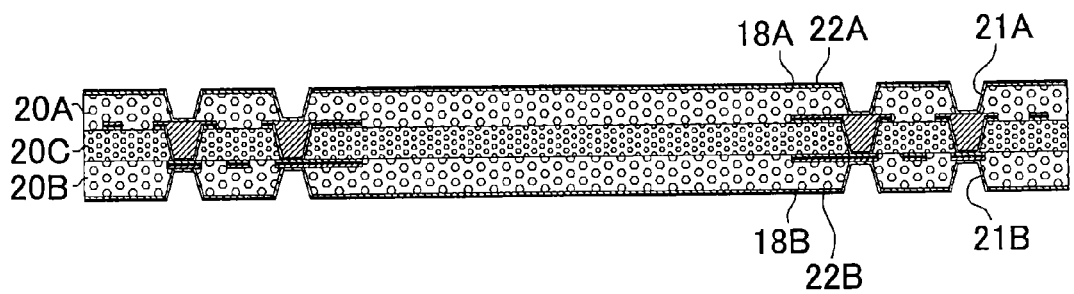

(9) By an electroless plating treatment, electroless plating films (22A, 22B) are formed on inner walls of the openings (21A, 21B) for the via conductors and on the metal foils (18A, 18B) (FIG. 5D).

Figure 6A:
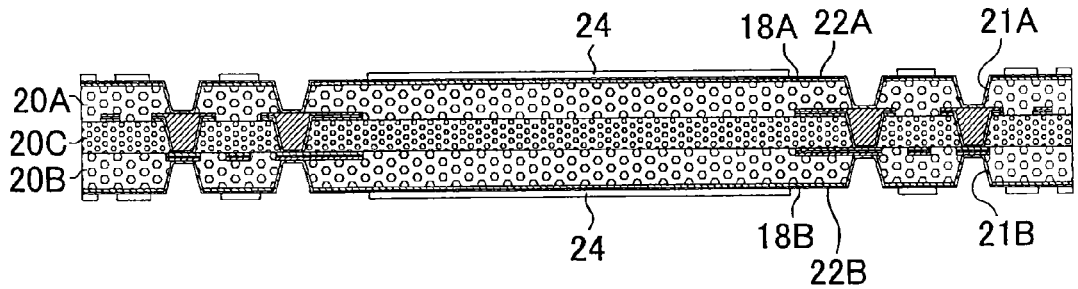
FIG. 6A-6D are process diagrams illustrating the method for manufacturing the printed wiring board of the first embodiment.

(10) Plating resists 24 are respectively formed on the electroless plating films (22A, 22B) (FIG. 6A).

Figure 6B:
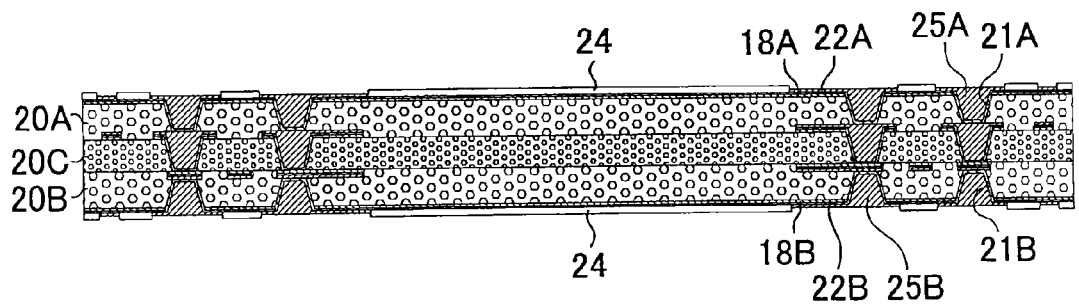

(11) Next, by an electrolytic plating treatment, electrolytic plating films (25A, 25B) are respectively formed on the electroless plating films (22A, 22B) that are respectively exposed from the plating resists 24 (see FIG. 6B).

Figure 6C:
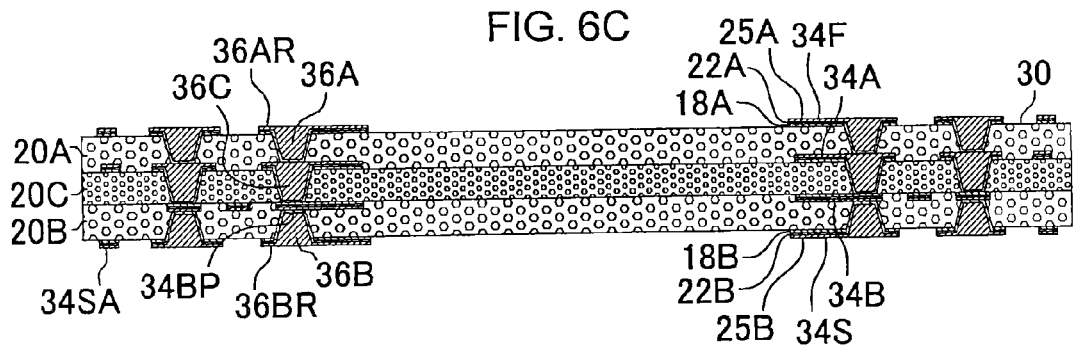

(12) Next, the plating resists are removed. Thereafter, the electroless plating films (22A, 22B) and the metal foils (18A, 18B) that are exposed from the electrolytic copper plating films (25A, 25B) are removed by etching, and the first conductor layer (34F) and the second conductor layer (34S) that are formed from the metal foils (18A, 18B), the electroless plating films (22A, 22B) and the electrolytic plating films (25A, 25B) are formed. At the same time, the via conductors (36A, 36B) are formed (FIG. 6C).

The second conductor layer (34S) includes an alignment mark (34SA). Further, the first conductor layer (34F) and the second conductor layer (34S) include conductor circuits and via conductor lands (36AR, 36BR).

Figure 6D:
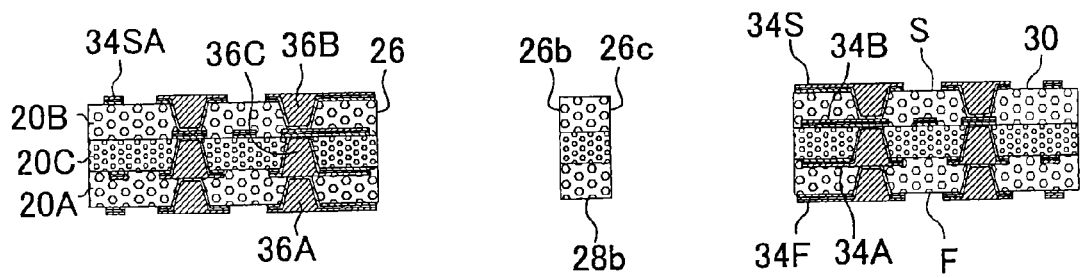

(13) The cavity (26) that reaches the first surface of the first resin layer (20A) from the second surface of the second resin layer (20B) is positioned using the alignment mark (34SA) in the second conductor layer as a reference and is formed using laser. The cavity 26 simultaneously penetrates through the first resin layer, the third resin layer and the second resin layer (FIG. 6D). The multilayer core substrate 30 having the resin layers is completed. The cavity 26 may also be tapered from the second surface toward the first surface.

Figure 7A:
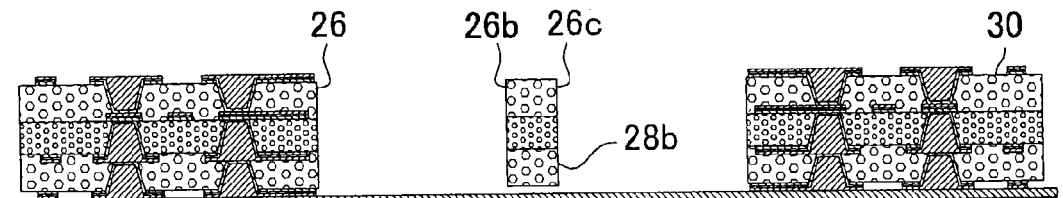
FIG. 7A-7E are process diagrams illustrating the method for manufacturing the printed wiring board of the first embodiment.

(14) The multilayer core substrate 30 is reversed so that the second surface (S) faces upward and the first surface (F) faces downward. A tape 94 is affixed to the first surface of the multilayer core substrate 30. The cavity 26 is closed by the tape (FIG. 7A). An example of the tape 94 is a PET film.

Figure 7B:
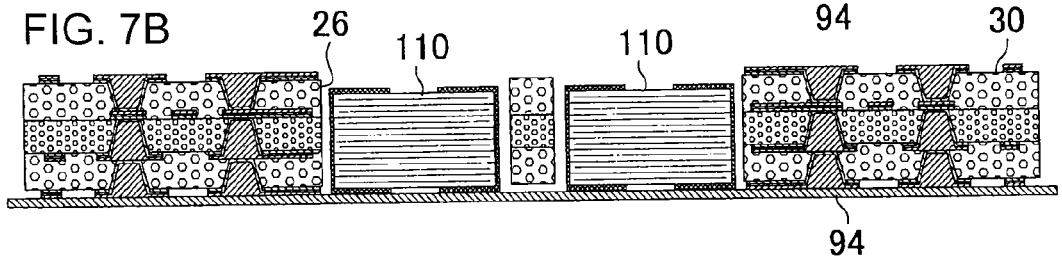

(15) On the tape 94 that is exposed by the cavity 26, the chip capacitor 110 is placed (FIG. 7B). The chip capacitor accommodated in the cavity 26 of the core substrate has a thickness of 45%-100% of that of the core substrate.

Figure 7C:
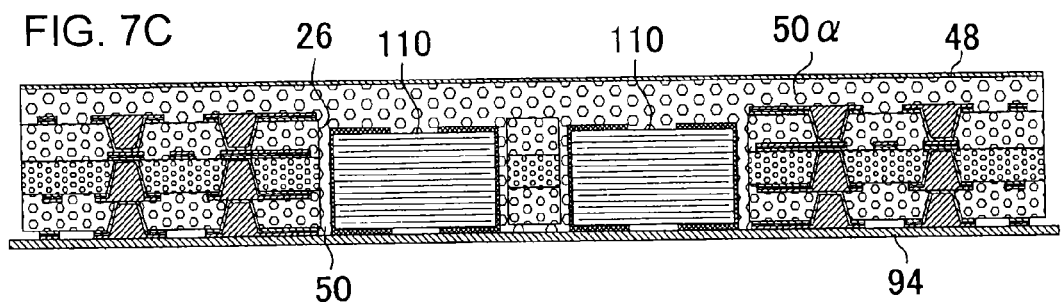

(16) A prepreg (50a) of a B-stage and a metal foil 48 are laminated on the second surface of the core substrate and on the electronic component. By hot pressing, resin seeps out from the prepreg into the cavity 26, and the cavity 26 is filled with a filler (resin filler) 50 (FIG. 7C). Spacing between an inner wall of the cavity 26 and the chip capacitor is filled with the filler. The chip capacitor is fixed in the core substrate. Instead of the prepreg, it is also possible that a resin film for an interlayer insulating layer is laminated. The prepreg has a reinforcing material such as a glass cloth. However, the resin film for an interlayer resin layer does not have a reinforcing material. It is preferable that both the prepreg and the resin film contain inorganic particles such as glass particles. The filler contains inorganic particles such as silica.

Figure 7D:
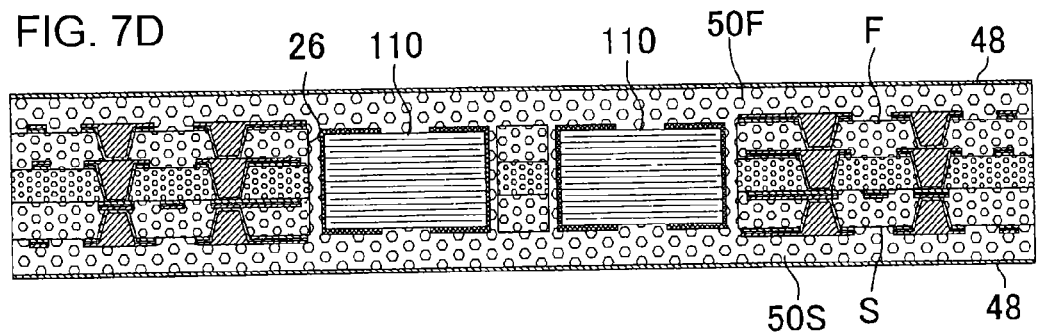
Figure 7E:
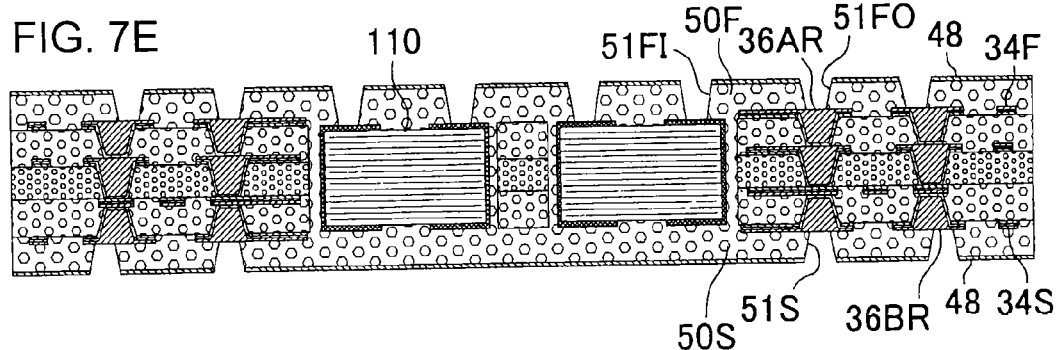

(17) After the tape is peeled off, the multilayer core substrate 30 is reversed so that the first surface (F) faces upward and the second surface (S) faces downward. A prepreg of a B-stage and a metal foil 48 are laminated on the first surface of the core substrate and on the electronic component. The prepregs that are laminated on both sides of the core substrate are heated and cured, and the interlayer resin insulating layers (50F, 50S) are formed (FIG. 7D). The interlayer resin insulating layer (50F) belongs to the upper side build-up layer, and the interlayer resin insulating layer (50S) belongs to the lower side build-up layer.

(18) An opening (51FO) for a via conductor that reaches the first conductor layer (34F) and the via land (36AR) of the first resin layer is formed in the interlayer resin insulating layer (50F). At the same time, an opening (51FI) for a via conductor that reaches the electrode 112 of the electronic component 110 is formed.

Figure 8A:
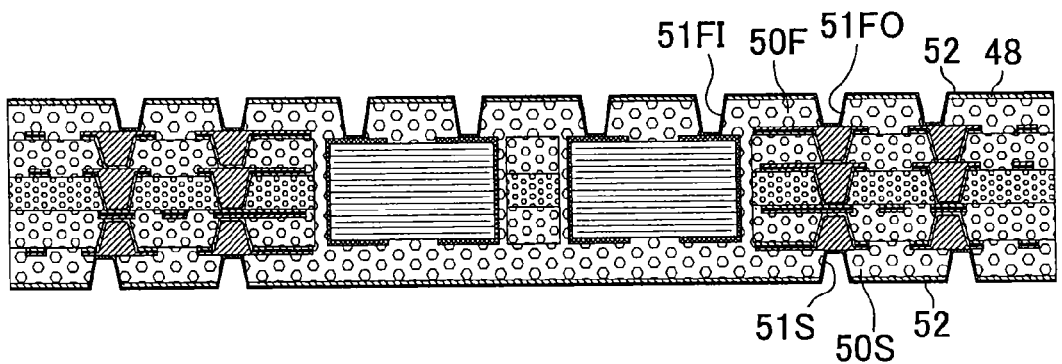
FIG. 8A-8D are process diagrams illustrating the method for manufacturing the printed wiring board of the first embodiment.
Figure 8B:
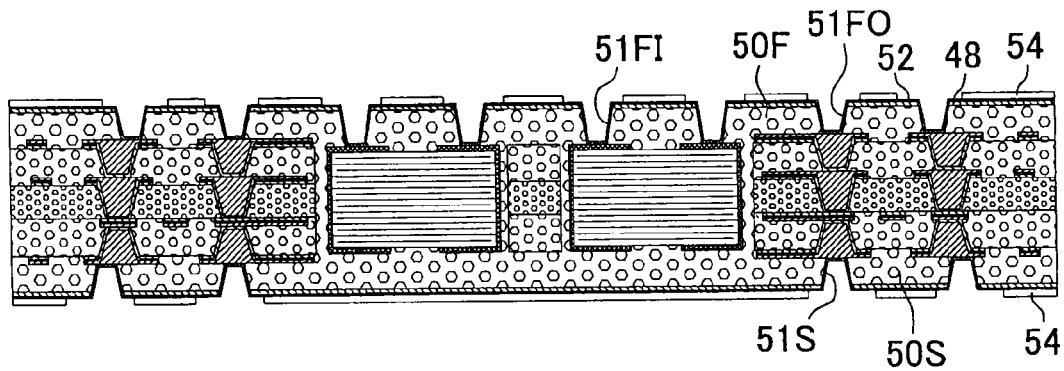
Figure 8C:
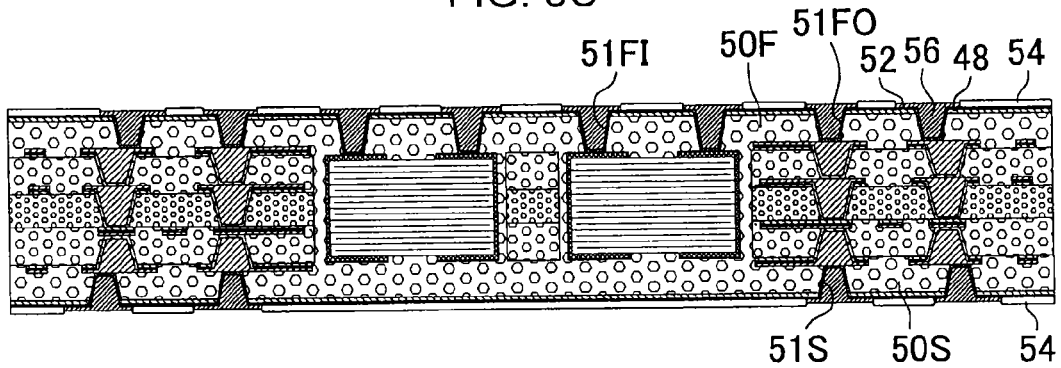
Figure 8D:
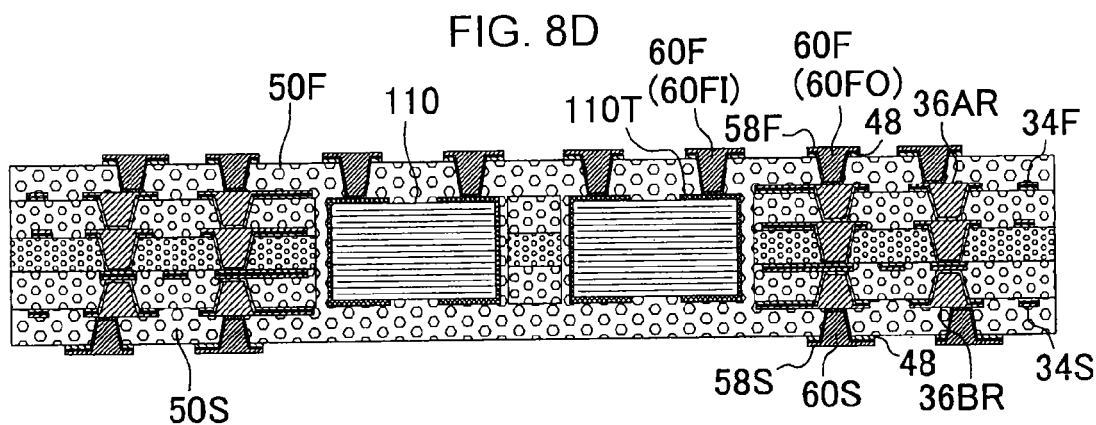

An opening (51S) for a via conductor that reaches the second conductor layer (34S) and the via land (36BR) of the second resin layer is formed in the interlayer resin insulating layer (50S). Electroless plating films 52 are formed on the metal foils (48, 48) and on inner walls of the openings (51FO, 51FI, 51S) (FIG. 8A). Thereafter, plating resists (54, 54) are formed on the electroless plating films (FIG. 8B). Next, electrolytic plating films (56, 56) are formed on the electroless plating films that are exposed from the plating resists (54, 54) (FIG. 8C). Then, the plating resists are removed, and the electroless plating films (52, 52) and the metal foils 48, 48 that are exposed from the electrolytic plating films are removed. The build-up layers are completed (FIG. 8D). The one-layer build-up layers are formed by the interlayer resin insulating layers (50F, 50S), the conductor layers (58F, 58S) on the interlayer resin insulating layers, and the via conductors (60FI, 60FO, 60S) that penetrate through the interlayer resin insulating layers. The via conductor (60FO) connects the first conductor layer (34F) and the via land (36AR) to the conductor layer (58F). The via conductor (60FI) connects the electrode 112 of the electronic component 110 to the conductor layer (58F). The via conductor (60S) connects the second conductor layer (34S) and the via land (36BR) to the conductor layer (58S). The build-up layer on the first surface of the core substrate is the upper side build-up layer, and the build-up layer on the second surface of the core substrate is the lower side build-up layer. The interlayer resin insulating layers (50F, 50S) each have a reinforcing material such as a glass cloth.

(19) Solder resist layers (70F, 70S) having openings 71 are formed on the upper side and lower side build-up layers. The openings 71 expose upper surfaces of the conductor layers and the via conductors. The exposed portions function as pads.

Figure 9A:
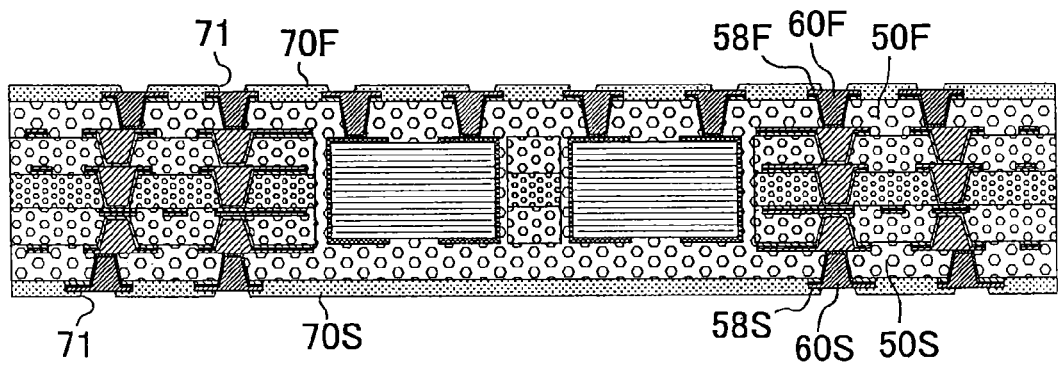
FIGS. 9A and 9B are process diagrams illustrating the method for manufacturing the printed wiring board of the first embodiment.
Figure 9B:
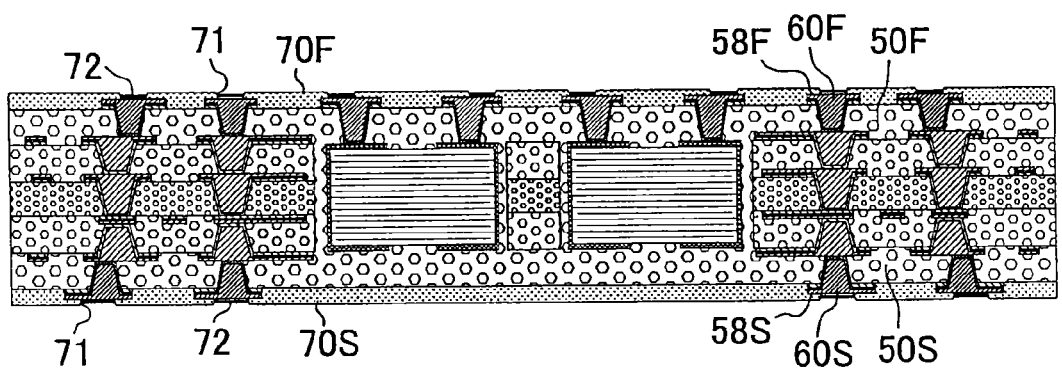

(20) On each of the pads, a metal film 72 is formed that includes a nickel layer and a gold layer on the nickel layer (FIG. 9B). Other than the nickel-gold layers, a metal film formed from nickel-palladium-gold layers may also be adopted. In the printed wiring board illustrated in FIG. 1, only the upper side build-up layer has a connection via conductor. The connection via conductor is a via conductor that connects to an electrode of an electronic component. Therefore, it is also possible that the lower side build-up layer does not have a conductor circuit on the lower side of the electronic component such as the chip capacitor. When the lower side build-up layer directly below the chip capacitor does not have a conductor circuit, warpage is likely to occur in the printed wiring board. In this case, it is preferable that the insulating layer of the upper side build-up layer have a thickness greater than that of the lower side build-up layer.

(21) Thereafter, the solder bump (76F) is formed on the pad of the upper side build-up layer and the solder bump (76S) is formed on the pad of the lower side build-up layer. The printed wiring board 10 having the solder bumps is completed (FIG. 1).

Via the solder bump (76F), an IC chip (not illustrated in the drawings) is mounted on the printed wiring board 10. Thereafter, via the solder bump (76S), the printed wiring board is mounted on a motherboard.

First Modified Example of First Embodiment

Figure 10A:
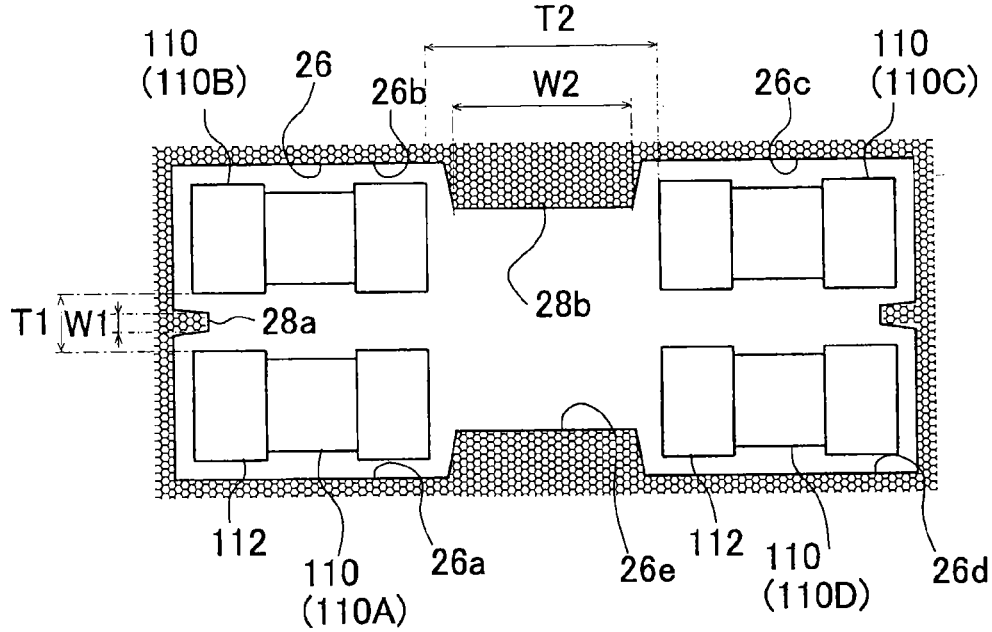
FIG. 10A illustrates a cavity according to a first modified example of the first embodiment.

FIG. 10A illustrates a cavity 26 according to a first modified example of the first embodiment.

The cavity 26 includes rectangular space parts (26a, 26b, 26c, 26d) for accommodating electronic components, and a first projection (28a), a second projection (28b), a third projection (28c) and a fourth projection (28c), having trapezoidal horizontal cross sections, for partitioning between the electronic components in the space part.

In the first modified example of the first embodiment, a distance (T1) between a first electronic component (110A) and a second electronic component (110B) a distance (T2) between the second electronic component (110B) and a third electronic component (110C), a width (W1) (a length of an upper base of the trapezoid) of the first projection (28a) and a width (W2) (a length of an upper base of the trapezoid) of the second projection (28b) satisfy T1<T2 and W1<W2.

Further, a distance (T3) between the third electronic component (110C) and a fourth electronic component (110D), a distance (T4) between the fourth electronic component (110D) and the first electronic component (110A), a width (W3) (a length of an upper base of the trapezoid) of the third projection (28c) and a width (W4) (a length of an upper base of the trapezoid) of the fourth projection (28d) satisfy T3<T4 and W3<W4.

In the first modified example of the first embodiment, the first projection (28a) having a small width of the width (W1) is provided between the first electronic component (110A) and the second electronic component (110B) that are arranged relatively closer to each other at the distance (T1); and the second projection (28b) having a large width of the width (W2) is provided between the second electronic component (110B) and the third electronic component (110C) that are arranged relatively farther away from each other at the distance (T2). The third projection (28c) having a small width of the width (W3) is provided between the third electronic component (110C) and the fourth electronic component (110D) that are arranged relatively closer to each other at the distance (T3). The fourth projection (28d) having a large width of the width (W4) is provided between the fourth electronic component (110D) and the first electronic component (110A) that are arranged relatively farther away from each other at the distance (T4). Therefore, the first electronic component, the second electronic component, the third electronic component and the fourth electronic component having different mutual distances are respectively properly positioned.

Second Modified Example of First Embodiment

Figure 10B:
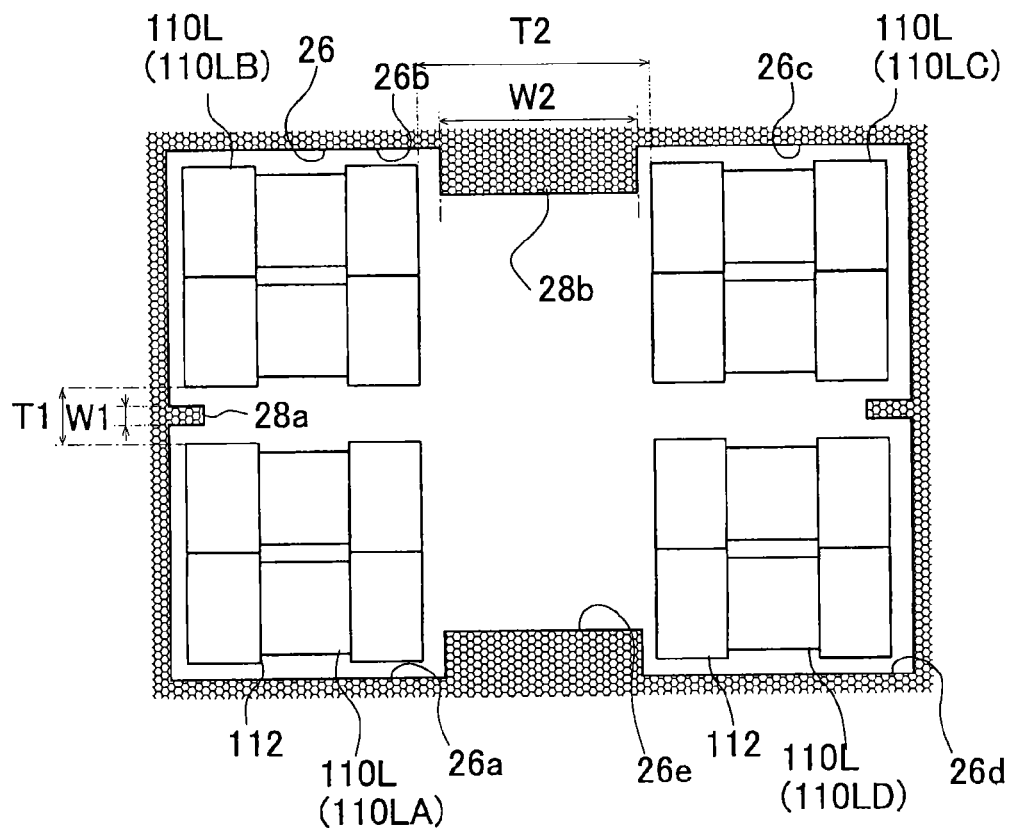
FIG. 10B illustrates a cavity according to a second modified example of the first embodiment.

FIG. 10B illustrates a cavity 26 according to a second modified example of the first embodiment.

In the second modified example of the first embodiment, electronic components (chip capacitors) (110L), in each of which two chip capacitors 110 are connected in parallel, are connected in the cavity 26.

In the second modified example of the first embodiment, the cavity 26 includes space parts (26a, 26b, 26c, 26d) that respectively accommodate the electronic components, and a first projection (28a), a second projection (28b), a third projection (28c) and a fourth projection (28c) that partition between the electronic components.

In the second modified example of the first embodiment, a distance (T1) between a first electronic component (110LA) and a second electronic component (110LB), a distance (T2) between the second electronic component (110LB) and a third electronic component (110LC), a width (W1) of a first projection (28a) and a width (W2) of a second projection (28b) satisfy T1<T2 and W1<W2.

Further, a distance (T3) between the third electronic component (110LC) and a fourth electronic component (110LD), a distance (T4) between the fourth electronic component (110LD) and the first electronic component (110LA), a width (W3) of a third projection (28c) and a width (W4) of a fourth projection (28d) satisfy T3<T4 and W3<W4.

In a printed wiring board of the second modified example of the first embodiment, the electronic components (110L) that are connected in parallel in the cavity can be properly positioned. In the second modified example of the first embodiment, an example is illustrated in which the chip capacitors are connected in parallel. However, in the structure of the embodiment, a case where chip capacitors are connected in series and a case where chip capacitors are connected in series and in parallel can also be similarly handled.

Third Modified Example of First Embodiment

Figure 3C:
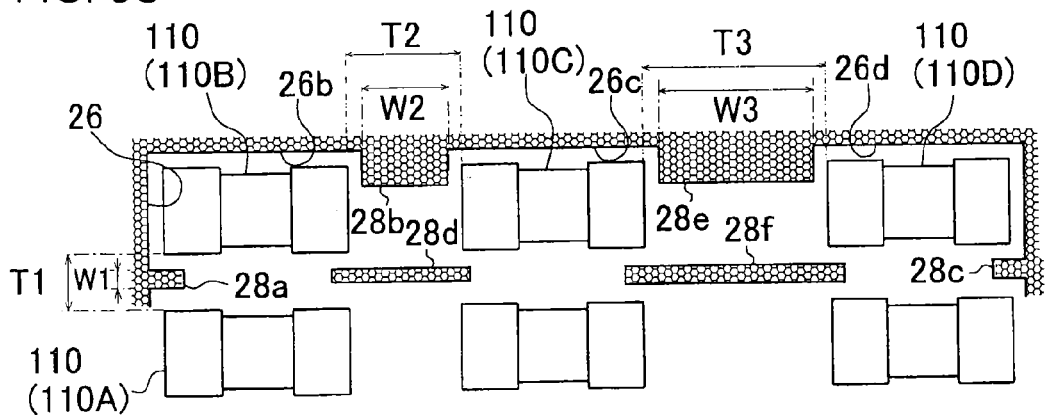

FIG. 3C illustrates a cavity 26 according to a third modified example of the first embodiment.

In the third modified example of the first embodiment, three electronic components including a second electronic component (110B), a third electronic component (110C) and a fourth electronic component (110D) are arranged in series. Between the second electronic component (110B) and the third electronic component (110C), a fifth projection (28d) opposing a second projection (28b) is provided. Between the third electronic component (110C) and the fourth electronic component (110D), a seventh projection (28f) opposing a sixth projection (28e) is provided. A width (W2) of a front end of the second projection (28b) is formed to be narrower than a width (W3) of a front end of the sixth projection (28e).

When chip capacitors are accommodated in one opening, there is a problem that, when positioning accuracy of the chip capacitors in the opening is low, connection to the chip capacitor by via conductors may be not possible and connection reliability is reduced.

A printed wiring board with a built-in electronic component according to an embodiment of the present invention enhances reliability.

A printed wiring board according to an embodiment of the present invention includes: a core substrate that has a cavity for accommodating an electronic component; a first electronic component, a second electronic component and a third electronic component that are accommodated in the cavity; and a build-up layer that includes an interlayer resin insulating layer that is formed on the core substrate and covers the cavity. Spaces that respectively accommodate the first electronic component, the second electronic component and the third electronic component, a first projection that partitions between the first electronic component and the second electronic component, and a second projection that partitions between the second electronic component and the third electronic component are formed in the cavity. A distance (T1) between the first electronic component and the second electronic component, a width (W1) of a front end of the first projection, a distance (T2) between the second electronic component and the third electronic component, and a width (W2) of a front end of the second projection satisfy T1<T2 and W1<W2.

In a printed wiring board according to an embodiment of the present invention, the spaces that respectively accommodate three or more electronic components and the first projection and the second projection that partition between the electronic components are formed in the cavity. The first projection having a small width of the width (W1) is provided between the first electronic component and the second electronic component that are arranged relatively closer to each other at the distance (T1). The second projection having a large width of the width (W2) is provided between the second electronic component and the third electronic component that are arranged relatively farther away from each other at the distance (T2). The first electronic component, the second electronic component and the third electronic component having different mutual distances can be respectively properly positioned. Further, even when electronic components having different mutual arrangement distances coexist, it does not cause a contact failure or the like to occur between the electronic components. Therefore, flexibility in designing a size of the cavity is increased.

Obviously, numerous modifications and variations of the present invention are possible in light of the above teachings.

It is therefore to be understood that within the scope of the appended claims, the invention may be practiced otherwise than as specifically described herein.

What is claimed is:

1. A printed wiring board, comprising:
a core substrate having a cavity;
a plurality of electronic components accommodated in the cavity of the core substrate; and
a build-up layer formed on the core substrate and comprising an insulating resin interlayer such that the insulating resin interlayer is covering the cavity,
wherein the plurality of electronic components includes a first electronic component, a second electronic component and a third electronic component, the core substrate has a first projection structure partitioning the first and second electronic components in the cavity and a second projection structure partitioning the second and third electronic components in the cavity, and the cavity and the first and second projection structures are formed in the core substrate such that T1<T2 and W1<W2 are satisfied where T1 represents a distance between the first and second electronic components, T2 represents a distance between the second and third electronic components, W1 represents a width of an edge of the first projection structure in the cavity, and W2 represents a width of an edge of the second projection structure in the cavity.

2. A printed wiring board according to claim 1, wherein the first projection structure is formed on a first cavity side wall of the core substrate, and the second projection structure is formed on a second cavity side wall of the core substrate.

3. A printed wiring board according to claim 1, wherein the plurality of electronic components includes a fourth electronic component, the core substrate has a third projection structure facing the first projection structure and partitioning the third and fourth electronic components in the cavity and a fourth projection structure facing the second projection structure and partitioning the first and fourth electronic components in the cavity, and the cavity and the third and fourth projection structures are formed in the core substrate such that T3<T4 and W3<W4 are satisfied where T3 represents a distance between the third and fourth electronic components, T4 represents a distance between the first and fourth electronic components, W3 represents a width of an edge of the third projection structure in the cavity, and W4 represents a width of an edge of the fourth projection structure in the cavity.

4. A printed wiring board according to claim 1, wherein the core substrate is a multilayer core substrate comprising a plurality of resin layers.

5. A printed wiring board according to claim 4, wherein the multilayer core substrate comprises a stacked via structure comprising a plurality of via conductors formed in the plurality of resin layers, respectively.

6. A printed wiring board according to claim 1, wherein the core substrate comprises a filler comprising resin and filling the cavity such that the electronic components are fixed in the cavity.

7. A printed wiring board according to claim 1, wherein the first projection structure comprises a projection having a rectangular shape, and the second projection structure comprises a projection having a rectangular shape.

8. A printed wiring board according to claim 1, wherein the first projection structure comprises a projection having a trapezoid shape, and the second projection structure comprises a projection having a trapezoid shape.

9. A printed wiring board according to claim 1, wherein each of the electronic components is a chip capacitor.

10. A printed wiring board according to claim 1, wherein the build-up layer comprises a conductor layer formed on the insulating resin interlayer and a plurality of via conductors formed through the insulating resin interlayer such that the plurality of via conductors is connecting the conductor layer and the electronic components in the cavity.

11. A printed wiring board according to claim 2, wherein the core substrate comprises a filler comprising resin and filling the cavity such that the electronic components are fixed in the cavity.

12. A printed wiring board according to claim 2, wherein the first projection structure comprises a projection having a rectangular shape, and the second projection structure comprises a projection having a rectangular shape.

13. A printed wiring board according to claim 2, wherein the first projection structure comprises a projection having a trapezoid shape, and the second projection structure comprises a projection having a trapezoid shape.

14. A printed wiring board according to claim 2, wherein each of the electronic components is a chip capacitor.

15. A printed wiring board according to claim 2, wherein the build-up layer comprises a conductor layer formed on the insulating resin interlayer and a plurality of via conductors formed through the insulating resin interlayer such that the plurality of via conductors is connecting the conductor layer and the electronic components in the cavity.

16. A printed wiring board according to claim 1, wherein the build-up layer comprises a conductor layer formed on the insulating resin interlayer and a plurality of via conductors formed through the insulating resin interlayer such that the plurality of via conductors is connecting the conductor layer and the electronic components in the cavity, and the conductor layer formed on the insulating resin interlayer includes a plurality of pads positioned to mount an IC chip on the build-up layer.

17. A printed wiring board according to claim 1, further comprising:
a second build-up layer formed on the core substrate and comprising an insulating resin interlayer such that the insulating resin interlayer is covering the cavity on an opposite side of the core substrate with respect to the build-up layer.

18. A printed wiring board according to claim 1, further comprising:
a second build-up layer formed on the core substrate and comprising an insulating resin interlayer such that the insulating resin interlayer is covering the cavity on an opposite side of the core substrate with respect to the build-up layer,
wherein the build-up layer comprises a conductor layer formed on the insulating resin interlayer and a plurality of via conductors formed through the insulating resin interlayer such that the plurality of via conductors is connecting the conductor layer and the electronic components in the cavity, and the conductor layer formed on the insulating resin interlayer includes a plurality of pads positioned to mount an IC chip on the build-up layer.

19. A printed wiring board according to claim 1, further comprising:
a second build-up layer formed on the core substrate and comprising an insulating resin interlayer such that the insulating resin interlayer is covering the cavity on an opposite side of the core substrate with respect to the build-up layer, wherein the build-up layer comprises a conductor layer formed on the insulating resin interlayer and a plurality of via conductors formed through the insulating resin interlayer such that the plurality of via conductors is connecting the conductor layer and the electronic components in the cavity, the conductor layer formed on the insulating resin interlayer in the build-up layer includes a plurality of pads positioned to mount an IC chip on the build-up layer, the second build-up layer comprises a conductor layer formed on the insulating resin interlayer such that the conductor layer formed on the insulating resin interlayer in the second build-up layer includes a plurality of pads positioned to mount a mother board on the second build-up layer.

20. A printed wiring board according to claim 16, wherein the core substrate is a multilayer core substrate comprising a plurality of resin layers.

* * * * *